United States Patent
Wu

(10) Patent No.: US 11,545,168 B2
(45) Date of Patent: Jan. 3, 2023

(54) AUDIO PROCESSING DEVICE AND ASSOCIATED AUDIO PROCESSING METHOD

(71) Applicant: Realtek Semiconductor Corp., HsinChu (TW)

(72) Inventor: Chia-Che Wu, HsinChu (TW)

(73) Assignee: Realtek Semiconductor Corp., HsinChu (TW)

( * ) Notice: Subject to any disclaimer, the term of this patent is extended or adjusted under 35 U.S.C. 154(b) by 35 days.

(21) Appl. No.: 17/232,165

(22) Filed: Apr. 16, 2021

(65) Prior Publication Data

US 2021/0358512 A1    Nov. 18, 2021

(30) Foreign Application Priority Data

May 18, 2020   (TW) .................................. 109116341

(51) Int. Cl.
| | |
|---|---|
| *G10L 21/0208* | (2013.01) |
| *H04S 7/00* | (2006.01) |
| *H04R 3/04* | (2006.01) |
| *G10L 21/0316* | (2013.01) |
| *H03G 5/16* | (2006.01) |
| *G10L 19/008* | (2013.01) |

(52) U.S. Cl.
CPC ........ *G10L 21/0208* (2013.01); *G10L 19/008* (2013.01)

(58) Field of Classification Search
CPC ............ G10L 21/0208; G10L 21/0316; G10L 19/008; H03G 3/32; H03G 3/3005; H03G 3/20; H03G 5/005; H03G 5/02; H03G 5/00; H03G 5/165; H03G 5/16; H03G 7/002; H04S 7/307; H04S 7/00; H04S 1/00; H04S 5/00; H04R 1/1083; H04R 3/04; G10K 11/178; G10K 11/16; G10K 11/175
USPC ............ 700/500–504, 94; 381/1–23, 56, 26, 381/312–321, 61, 63, 71.1–71.12, 72, 74, 381/94.1–94.9, 97–110, 118, 119, 120, 381/122, 123
See application file for complete search history.

(56) References Cited

U.S. PATENT DOCUMENTS

| | | | |
|---|---|---|---|
| 2003/0035549 A1* | 2/2003 | Bizjak .................... | H03G 7/007 381/104 |
| 2013/0163784 A1* | 6/2013 | Tracey .................... | H04R 3/04 381/103 |
| 2016/0203811 A1* | 7/2016 | Brockmole ............... | H04S 7/30 381/94.5 |

FOREIGN PATENT DOCUMENTS

CN          110603582 A          12/2019

* cited by examiner

*Primary Examiner* — Leshui Zhang
(74) *Attorney, Agent, or Firm* — Winston Hsu

(57) ABSTRACT

An audio processing device is disclosed. The audio processing device includes a filter and an output circuit. The filter is configured to receive an audio signal to generate a filtered audio signal, wherein the filter includes a plurality of parameters that are adjustable for changing a bandwidth, a center frequency or a gain of response of the filter. The output circuit is configured to receive the filtered audio signal to generate an output audio signal to a speaker. When the parameters of the filter are changed, the filter reduces changes in the audio signal caused by the parameters, and the output circuit continuously receives the filtered audio signal to generate the output audio signal for the speaker to play without interruption.

8 Claims, 5 Drawing Sheets

AUDIO PROCESSING DEVICE AND ASSOCIATED AUDIO PROCESSING METHOD

BACKGROUND OF THE INVENTION

1. Field of the Invention

The present invention is related to an audio processing device.

2. Description of the Prior Art

In conventional audio processing devices, a filter may be configured to have multiple adjustable parameters for changing a bandwidth, a center frequency and/or a response gain of the filter, allowing a user to adjust the audio quality or features according to their particular requirements. As the changing response of the filter may result in abnormal sounds, especially when changes in the output audio signal are too big, a mute circuit may be configured in the conventional audio processing device, to temporarily stop a speaker from outputting the audio signal while parameters of the filter are changed. Although the mute circuit can prevent the user from hearing abnormal audio signals, the output sound will still be interrupted, which impacts the overall audio quality.

SUMMARY OF THE INVENTION

This in mind, an objective of the present invention is to provide an audio processing device and an audio processing method which can directly change parameters of a filter without interrupting playback while preventing abnormal sounds and sound effects, so the problem mentioned in the related art can be solved.

In an embodiment of the present invention, an audio processing device is disclosed. The audio processing device comprises a filter and an output circuit coupled to the filter. The filter is configured to receive an audio signal to generate a filtered audio signal, wherein the filter comprises a plurality of parameters that are adjustable, for changing a bandwidth, a center frequency or a gain of response of the filter. The output circuit is configured to receive the filtered audio signal to generate an output audio signal to a speaker. When the parameters of the filter are changed, the filter reduces changes in the audio signal caused by the parameters, and the output circuit continuously receives the filtered audio signal to generate the output audio signal, enabling the speaker to play the output audio signal without interruption.

In another embodiment of the present invention, an audio processing method is disclosed. The audio processing method comprises the following steps: utilizing a filter to receive an audio signal to generate a filtered audio signal; changing a plurality of parameters of the filter to change a bandwidth, a center frequency or a gain of response of the filter, wherein when the parameters are changed, reducing changes in the audio signal caused by the parameters of the filter; and continuously receiving the filtered audio signal to generate an output audio signal, enabling a speaker to play the output audio signal without interruption during the process of changing the parameters of the filter.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
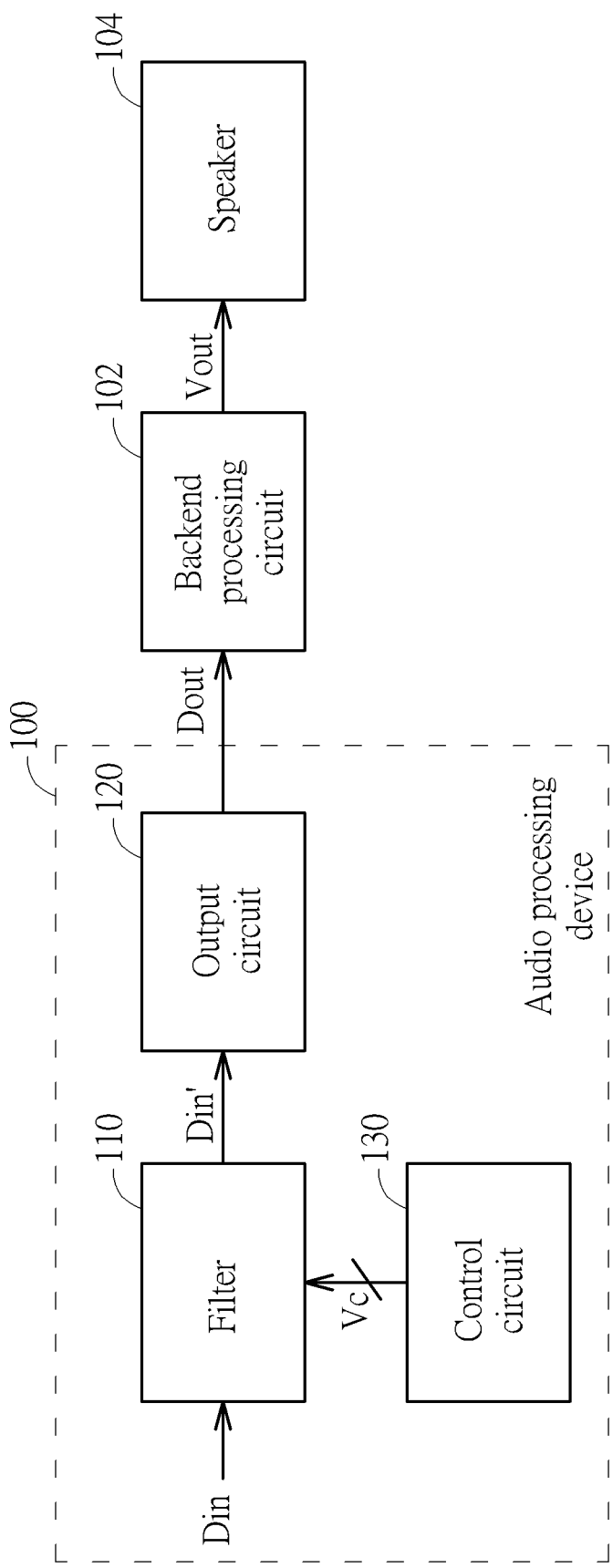
FIG. 1 is a diagram illustrating an audio processing device according to an embodiment of the present invention.

FIG. 1 is a diagram illustrating an audio processing device 100 according to an embodiment of the present invention. As shown in FIG. 1, the audio processing device 100 comprises a filter 110, an output circuit 120 and a control circuit 130, and the audio processing device 100 is configured to process an audio signal Din to generate an output audio signal Dout, which is transmitted to a speaker 104 for playback after being processed by a backend processing circuit 102. In particular, the filter 110 within the audio processing device 100 may be an infinite impulse response (IIR) filter or other types of digital filters, and is configured to perform a filtering operation upon the audio signal Din to generate a filtered audio signal Din'. The output circuit 120 then processes the filtered audio signal Din' to generate the output audio signal Dout, and the backend processing circuit 102 further performs backend processing upon the output audio signal Dout to generate a signal Vout to the speaker for playback. In one embodiment, the output audio signal Dout may be a digital signal, and the backend processing circuit 102 comprises components such as a digital-to-analog converter and an analog amplifier. In another embodiment, the output circuit 120 comprises a digital-to-analog converter, which means the output audio signal Dout is an analog signal, and the backend processing circuit 102 may comprise an analog amplifier and associated interface circuits. Furthermore, in this embodiment, the audio processing device 100 may be applied to any electronic device that has an audio playback function, such as earphones, loudspeakers, laptop computers, desktop computers, tablets, mobile phones, televisions, etc.

Figure 2:
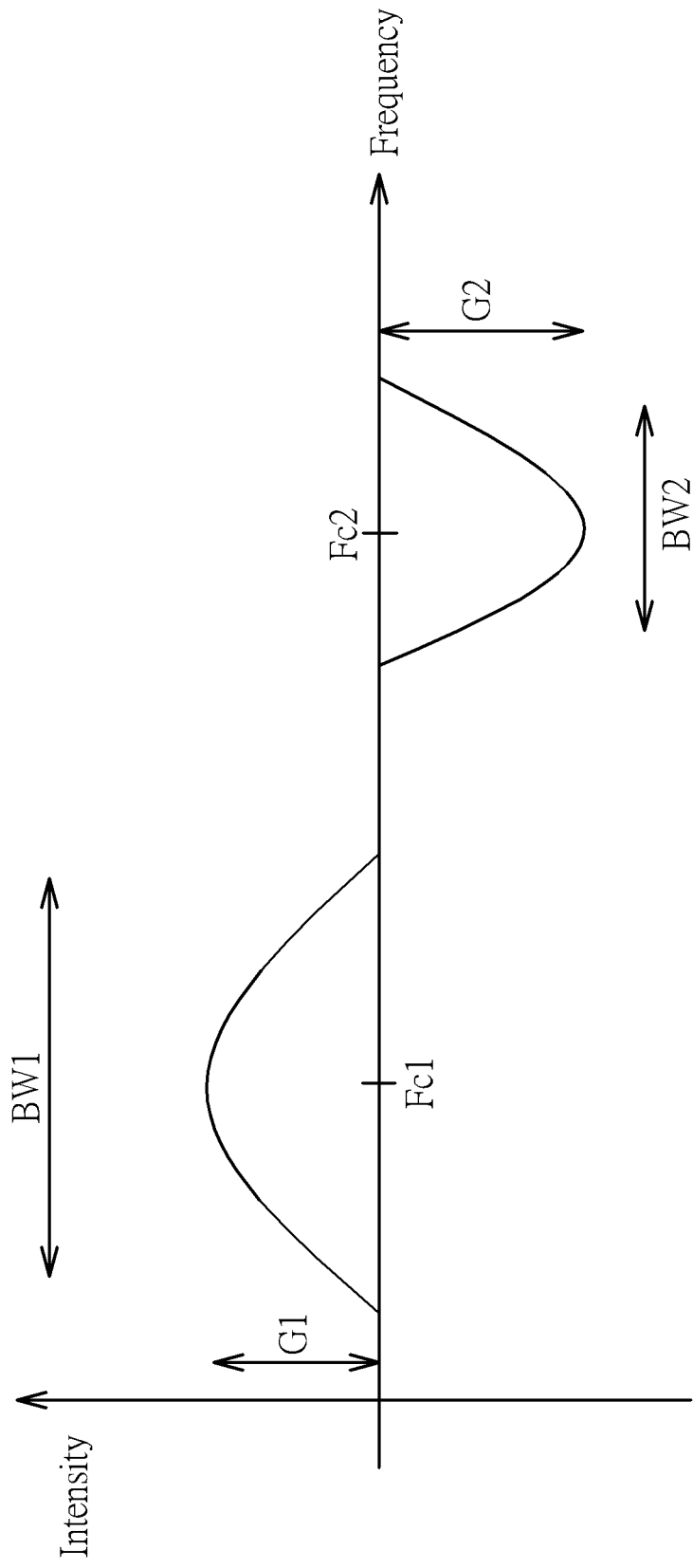
FIG. 2 is a diagram illustrating that frequency response of a filter is changed.

In this embodiment, for the purpose of allowing a user to control the wanted audio quality or audio features, the control circuit 130 within the audio processing device 100 may generate a plurality of control signals Vc according to commands of other components or input signals of the user, to thereby change a bandwidth, a center frequency and/or a gain of response of the filter 110 (e.g. filter response) via changing a plurality of parameters of the filter 110. Taking FIG. 2 as an example for illustration, assuming that an original response of the filter 110 has a bandwidth BW1, a center frequency Fc1 and a gain G1 through parameter setting of the filter 110, the control circuit 130 may change the parameters of the filter 110 according to input signals from the user, to make the response of the filter 110 have a different bandwidth BW2, center frequency Fc2 and gain G2. As there is a need for a stable time period to change the parameters of the filter 110, a mute mechanism may be required to prevent the speaker 104 from playing sound while changing the parameters of the filter 110, in order to prevent the user from hearing abnormal sounds. Adopting this mute mechanism may interrupt audio playback, however, thereby impacting audio quality. This in mind, a transfer function of the filter 110 has a different design, and the control signals Vc generated by the control circuit 130 may be configured to further control the filter 110 in order to prevent abnormal sound during the process of changing the parameters while allowing the speaker 104 to play the audio signal without interruption, to solve the aforementioned problem.

Figure 3:
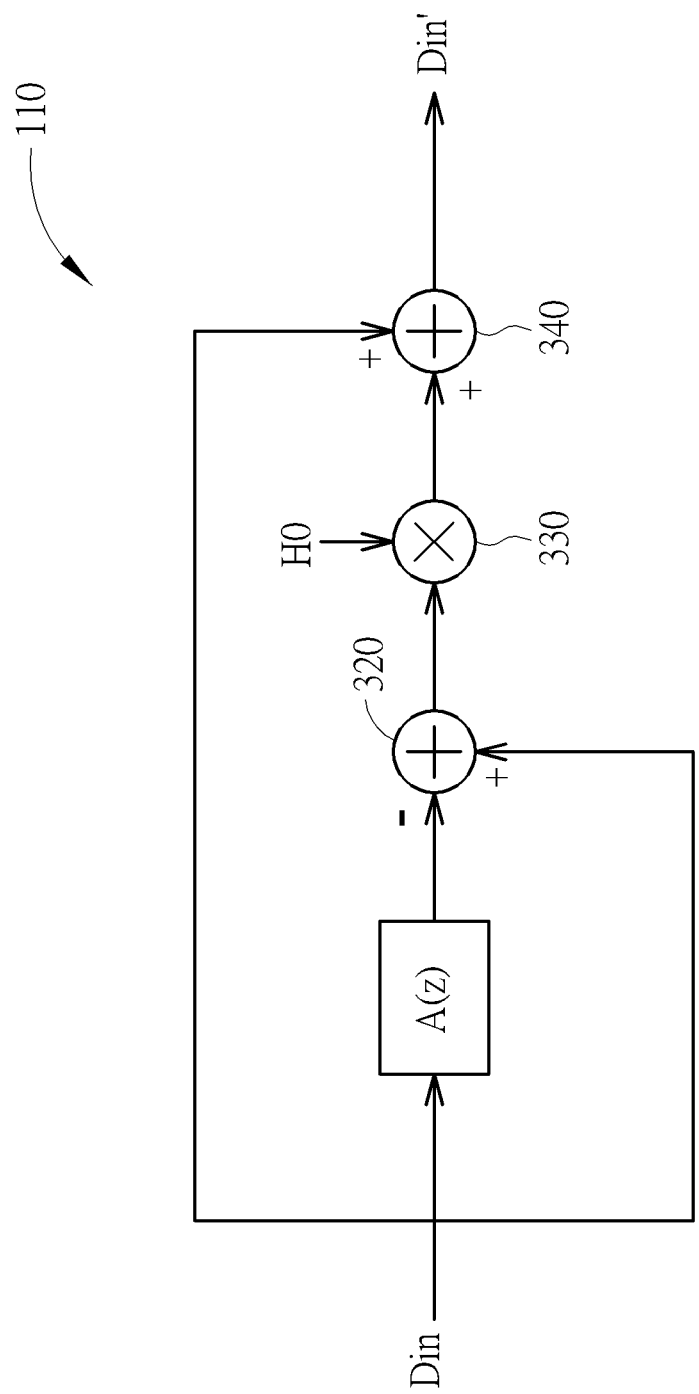
FIG. 3 illustrates architecture of a filter according to an embodiment of the present invention.

In particular, FIG. 3 illustrates an architecture of the filter 110 according to an embodiment of the present invention, where the architecture shown in FIG. 3 is illustrated using a mathematical form, and the filter 110 comprises a multi-order function A(z), two adders 320 and 340, and a multiplier 330. A transfer function H(z) of the filter 110 may be expressed as $H(z)=1+H0*(1-A(z))$, where H0 is an adjustable gain value. The multi-order function A(x) may be expressed as $b0+b1z^{-1}+b2z^{-2}/1+a1z^{-1}+a2z^{-2}$ or other types of multi-order functions, where b0, b1, a1 and a2 are the parameters of the filter 110.

Figure 4:
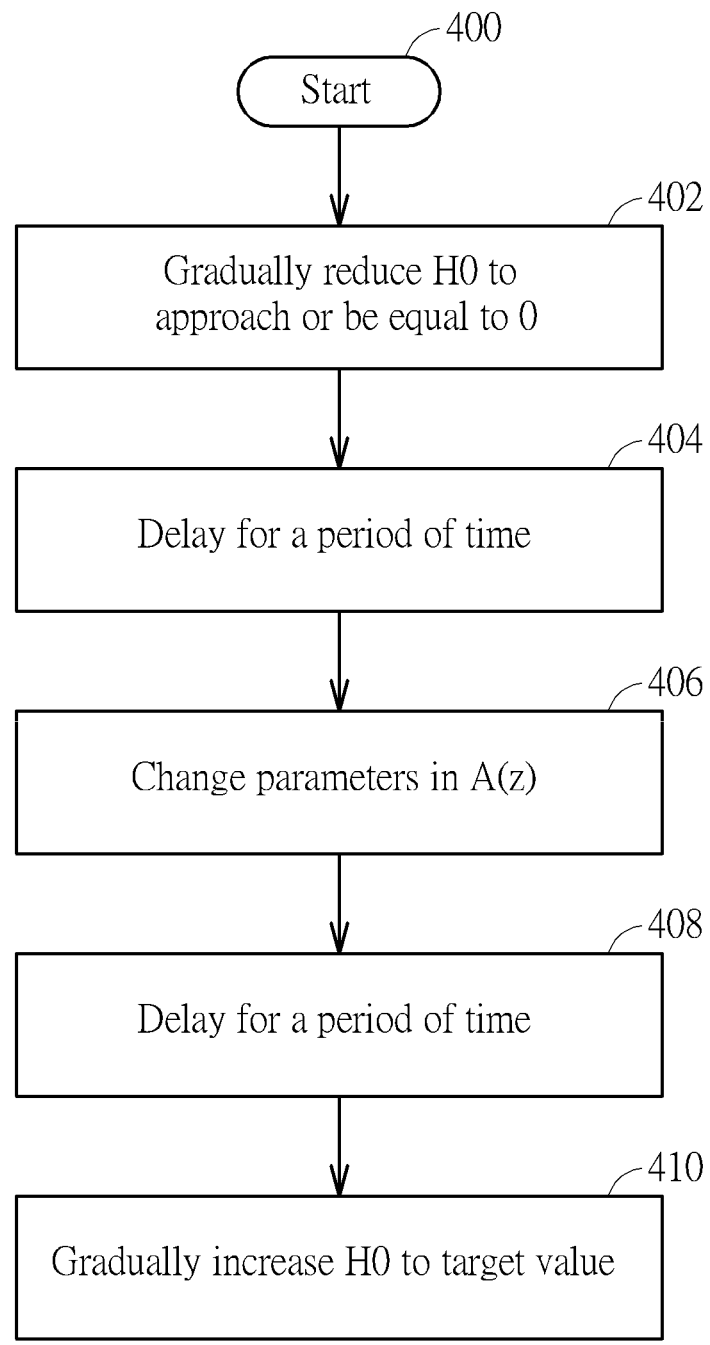
FIG. 4 is a flowchart illustrating an audio processing method according to an embodiment of the present invention.

Refer to the flow shown in FIG. 4. In Step 400, the flow starts, and the control circuit 130 receives commands of other components or input signals from the user, which are requests to change the frequency response (i.e. the bandwidth, the center frequency and/or the gain) of the filter 110. In Step 402, the control circuit 130 generates the control signals Vc to gradually reduce (e.g. reduce in a stepwise manner) the adjustable gain value H0 shown in FIG. 3, meaning the filter is controlled to gradually reduce changes in the audio signal Din, making the filtered audio signal Din' gradually approach the audio signal Din. In detail, when the adjustable gain value H0 is reduced, as the changes H0*A(z) in the audio signal Din caused by the parameters are reduced, the transfer function H(z) of the filter 110 may gradually approach "1", which makes the filtered audio signal Din' gradually approach the audio signal Din. In one embodiment, the adjustable gain value may eventually be reduced to zero, so that the filtered audio signal Din' is substantially equal to the audio signal Din.

In one embodiment, by reducing the adjustable gain value H0 in a stepwise manner, the amount the adjustable gain value H0 is reduced each time may be designed as a gain change amount that is unable to be heard by the user.

In Step 404, in consideration of some timing errors or circuit delay, the control circuit 130 may temporarily stop controlling the filter 110, i.e. wait/delay for a period of time.

In Step 406, the control circuit 130 generates the control signals Vc to directly change the parameters of the filter 110, i.e. change the parameters in the multi-order function A(z). In one embodiment, the parameters of the filter 110 are directly replaced (e.g. with final target values) to accelerate setting and operations of the filter 110, meaning there is no need for indirectly changing or sequentially changing the filter parameters.

In Step 408, in consideration of some timing errors or circuit delay, the control circuit 130 may temporarily stop controlling the filter 110, i.e. wait/delay for a period of time.

In Step 410, the control circuit 130 generates the control signals Vc to gradually increase (e.g. increase in a stepwise manner) the adjustable gain value H0 to a target value, i.e. the filter is controlled to gradually increase changes in the audio signal Din caused by the parameters, to complete the whole flow of changing the parameters of the filter 110. In one embodiment, in the aforementioned process of increasing the adjustable gain value H0 in a stepwise manner, the amount of increasing the adjustable gain value H0 each time may be designed as a gain change amount that is unable to be heard by the user.

It should be noted that Steps 404 and 408 are optional steps; i.e. Steps 404 and 408 may be removed from the flow without affecting main operations of the present invention.

Figure 5:
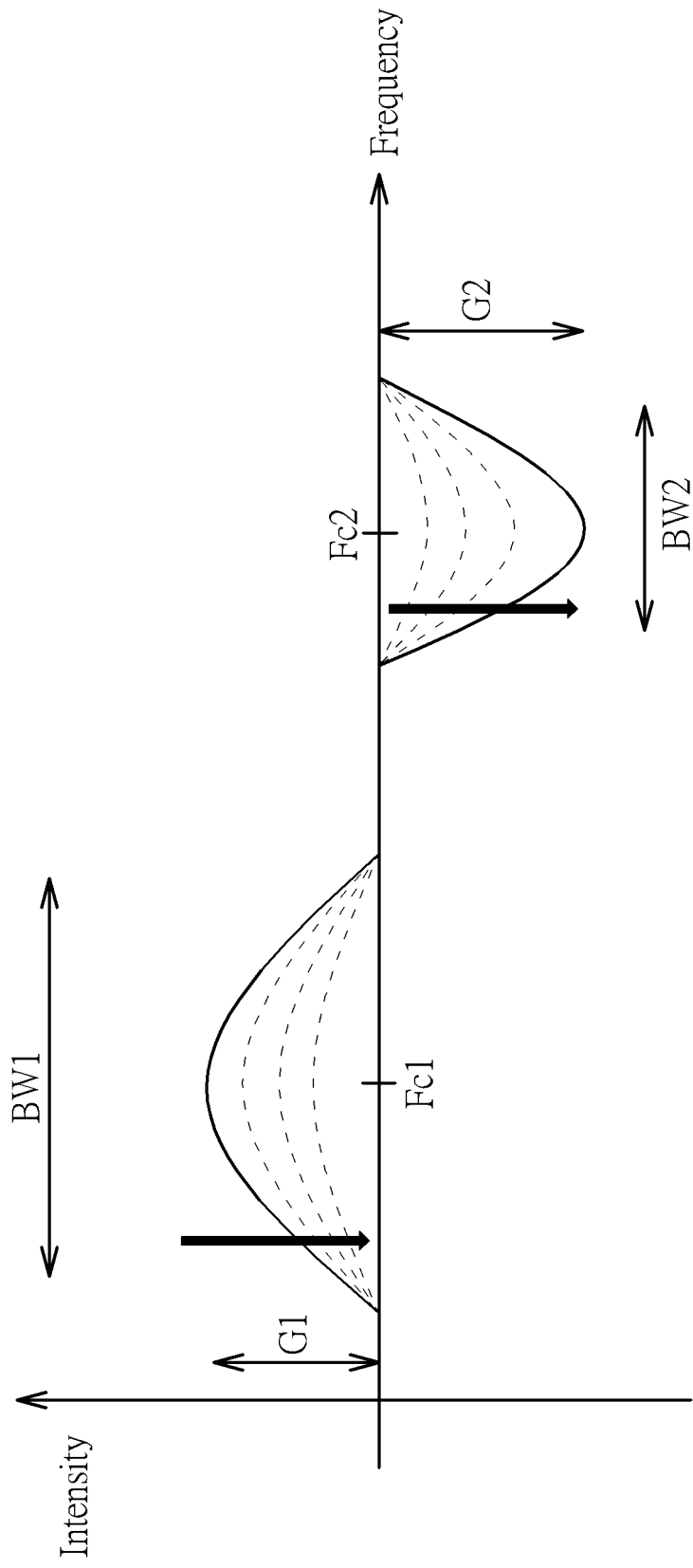
FIG. 5 is a diagram illustrating that frequency response of a filter is changed according to an embodiment of the present invention.

FIG. 5 is a diagram illustrating the flow of changing the parameters of the filter 110 shown in FIG. 4. In FIG. 5, the frequency response of the filter 110 originally has the bandwidth BW1, the center frequency Fc1 and the gain G1. Before the parameters of the filter 110 need to be changed, the adjustable gain value H0 may be gradually reduced to make the frequency response thereof approach "1". After setting of the filter parameters is completed, the adjustable gain value H0 may be gradually increased, to make the frequency response of the filter 110 have the bandwidth BW2, the center frequency Fc2 and the gain G2.

In the above process of changing the parameters of the filter 110, the output circuit 120 may keep generating the output audio signal Dout to the backend processing circuit 102 in order to generate the signal Vout to the speaker 104 for playback without interruption. As the filtered audio signal Din' is substantially equal to the audio signal Din when the parameters are being changed and the filter is in an unstable state, during the whole process of changing the parameters, normal audio quality can be provided for the user without any mute mechanism, so the problem mentioned in the related art can be effectively solved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An audio processing device, comprising:
   a filter, configured to receive an audio signal to generate a filtered audio signal, wherein transfer function of the filter is $H(z)=1+H0*(1-A(z))$, H0 is an adjustable gain value, A(z) is a multi-order function controlled by a plurality of parameters, and z is a frequency parameter; and
   an output circuit, coupled to the filter, configured to receive the filtered audio signal to generate an output audio signal to a speaker;
   wherein when the transfer function of the filter is changed, the filter reduces the adjustable gain value before the parameters are changed, and the output circuit continuously receives the filtered audio signal to generate the output audio signal for the speaker to play the output audio signal without interruption.

2. The audio processing device of claim 1, wherein before the parameters are changed, the filter gradually reduces the adjustable gain value, to make the transfer function approach a value of one.

3. The audio processing device of claim 2, wherein before the parameters are changed, the filter gradually reduces the adjustable gain value, to make the transfer function be equal to one.

4. The audio processing device of claim 2, wherein during a period after the transfer function approaches one, the filter gradually increases the adjustable gain value to a target value.

5. An audio processing method, comprising:
- utilizing a filter to receive an audio signal to generate a filtered audio signal, wherein a transfer function of the filter is $H(z)=1+H0*(1-A(z))$, H0 is an adjustable gain value, $A(z)$ is a multi-order function controlled by a plurality of parameters, and z is a frequency parameter;
- when the transfer function of the filter is changed, reducing the adjustable gain value before the parameters are changed; and
- continuously receiving the filtered audio signal to generate an output audio signal, for a speaker to play the output audio signal without interruption during the process of changing the parameters.

6. The audio processing method of claim 5, wherein when the transfer function is changed, the step of reducing the adjustable gain value before the parameters are changed comprises:
- before the parameters are changed, gradually reducing the adjustable gain value, to make the transfer function approach a value of one.

7. The audio processing method of claim 6, wherein when the transfer function is changed, the step of reducing the adjustable gain value before the parameters are changed comprises:
- before the parameters are changed, gradually reducing the adjustable gain value, to make the transfer function be equal to one.

8. The audio processing method of claim 6, further comprising:
- during a period after the transfer function approaches one, gradually increasing the adjustable gain value to a target value.

* * * * *